(12) United States Patent
Gerhard et al.

(10) Patent No.: US 10,505,337 B2
(45) Date of Patent: Dec. 10, 2019

(54) METHOD FOR PRODUCING A LASER DIODE BAR AND LASER DIODE BAR

(71) Applicant: OSRAM Opto Semiconductors GmbH, Regensburg (DE)

(72) Inventors: Sven Gerhard, Alteglofsheim (DE); Andreas Löffler, Neutraubling (DE)

(73) Assignee: OSRAM OPTO SEMICONDUCTOR GMBH, Regensburg (DE)

( * ) Notice: Subject to any disclaimer, the term of this patent is extended or adjusted under 35 U.S.C. 154(b) by 0 days.

(21) Appl. No.: 16/156,134

(22) Filed: Oct. 10, 2018

(65) Prior Publication Data
US 2019/0115716 A1    Apr. 18, 2019

(30) Foreign Application Priority Data

Oct. 12, 2017 (DE) ................. 10 2017 123 755

(51) Int. Cl.
*H01S 5/00* (2006.01)
*G01R 31/26* (2014.01)
*H01S 5/02* (2006.01)
*H01S 5/028* (2006.01)
*H01S 5/042* (2006.01)
*H01S 5/323* (2006.01)
*H01S 5/40* (2006.01)

(52) U.S. Cl.
CPC ........ *H01S 5/0014* (2013.01); *G01R 31/2635* (2013.01); *H01S 5/0216* (2013.01); *H01S 5/0282* (2013.01); *H01S 5/0425* (2013.01); *H01S 5/32308* (2013.01); *H01S 5/4025* (2013.01); *H01S 5/0281* (2013.01)

(58) Field of Classification Search
CPC .... H01S 5/0014; H01S 5/4025; H01S 5/0216; H01S 5/0282; H01S 5/0425; H01S 5/32308; H01S 5/0281; G01R 31/2635
See application file for complete search history.

(56) References Cited

U.S. PATENT DOCUMENTS

| 4,489,477 A | 12/1984 | Chik et al. |
| 5,986,798 A * | 11/1999 | Karlsson ................. C30B 33/00 |
| | | 359/326 |
| 2002/0027231 A1* | 3/2002 | Okada ............... H01L 27/14618 |
| | | 257/118 |

(Continued)

FOREIGN PATENT DOCUMENTS

| DE | 10013265 A1 | 10/2001 |
| JP | 3286547 A | 12/1991 |

(Continued)

*Primary Examiner* — Xinning(Tom) Niu
(74) *Attorney, Agent, or Firm* — Slater Matsil, LLP

(57) ABSTRACT

A diode bar and a method for producing a laser diode bar are disclosed. In an embodiment a laser diode bar includes a plurality of emitters arranged side by side, the each emitter having a semiconductor layer sequence with an active layer suitable for generating laser radiation, a p-contact and an n-contact, wherein the emitters comprise a group of electrically contacted first emitters and a group of non-electrically contacted second emitters, wherein the p-contacts of the first emitters are electrically contacted by a p-connecting layer, and wherein the p-contacts of the second emitters are separated from the p-connecting layer by an electrically insulating layer and are not electrically contacted.

16 Claims, 4 Drawing Sheets

(56) References Cited

U.S. PATENT DOCUMENTS

| | | |
|---|---|---|
| 2003/0076863 A1 | 4/2003 | Zelenka |
| 2005/0111506 A1* | 5/2005 | Ohta .................. H01S 5/2231 |
| | | 372/45.01 |
| 2009/0032908 A1* | 2/2009 | Masui .................. H01L 22/12 |
| | | 257/623 |
| 2010/0208261 A1* | 8/2010 | Sens ..................... G01J 3/10 |
| | | 356/326 |
| 2015/0236472 A1 | 8/2015 | Ide et al. |
| 2018/0102323 A1 | 4/2018 | Kurz et al. |

FOREIGN PATENT DOCUMENTS

| | | |
|---|---|---|
| WO | 2016166235 A1 | 10/2016 |
| WO | 2017216157 A | 12/2017 |

* cited by examiner

METHOD FOR PRODUCING A LASER DIODE BAR AND LASER DIODE BAR

CROSS-REFERENCE TO RELATED APPLICATIONS

This application claims the benefit of German patent application 10 2017 123 755.0, filed on Oct. 12, 2017, which application is hereby incorporated herein by reference.

TECHNICAL FIELD

The invention concerns a method for producing of a laser diode bar and a laser diode bar which can be produced by this method.

BACKGROUND

Laser diode bars based on a nitride compound semiconductor material, in particular InAlGaN, can emit radiation in the visible spectral range. However, the production of efficient laser diode bars from nitride compound semiconductors is difficult since increased defect densities may occur in its material system compared to other material systems such as InAlGaAs.

SUMMARY

Embodiments provide a laser diode bar and a method for its production, wherein the laser diode bar provides improved efficiency.

According to embodiments a laser diode bar, a plurality of emitters arranged side by side is produced, the emitters being advantageously electrically contactable separately. The emitters each have a semiconductor layer sequence suitable for emitting laser radiation. For example, the semiconductor layer sequence of the emitters has an n-type semiconductor region, a p-type semiconductor region and an active layer arranged between them, which is suitable for generating laser radiation. The n-type semiconductor region, the active layer and the p-type semiconductor region may each have one or more sublayers. It is possible that the n-type semiconductor region, the active layer and the p-type semiconductor region contain one or more undoped layers.

According to further embodiments, each emitter has a p-contact and an n-contact. Preferably, the p-contact of the emitters is located on a first main surface of the laser diode bar and the n-contact is located on an opposite second main surface of the laser diode bar. In other words, the p-contact and the n-contact, seen from the active layer, are opposite to each other. In an embodiment, the emitters have a common n-contact and separate p-contacts. The p-contacts and/or the n-contact may in particular be contact pads made of a metal or metal alloy, for example, contact pads containing or consisting of gold.

The first main surface can face a carrier such as a heat sink and serve as a mounting surface for the laser diode bar. The second main surface can be a surface of the laser diode bar facing away from the carrier.

In this method at least one optical and/or electrical property of the emitters is tested. Here, those emitters for which the optical and/or electrical property lies within a specified setpoint range are assigned to a group of first emitters. On the other hand, emitters for which the optical and/or electrical property is outside the specified setpoint range are assigned to a group of second emitters.

The emitters can be assigned to the group of the first emitters or group of the second emitters, for example, by carrying out a test operation of the emitters and measuring the at least one optical and/or electrical property. During test operation, the emitters can be electrically contacted and operated with an electric current, at least temporarily. The electrical and/or optical property can be in particular the emitted intensity at a given current intensity. Furthermore, the optical and/or electrical property tested on the emitters may be a threshold current at which the laser emission of the emitters begins.

According to at least one embodiment, in a further step an electrically insulating layer is applied at least to the p-contacts of the second emitters. The electrically insulating layer covers the p-contacts of the second emitters advantageously completely, especially on the surface facing away from the semiconductor layer sequence as well as on the side surfaces of the p-contacts.

According to at least one embodiment, the p-contacts of the first emitters are electrically contacted in a subsequent method step. For this purpose, a p-connection layer is applied to the p-contacts of the first emitters. The p-connection layer is, for example, a metallic layer, in particular a solder layer. The p-connection layer can be applied over the entire surface of the p-contacts arranged on the first main surface. The second emitters are advantageously separated from the p-connection layer by the previously applied electrically insulating layer and are therefore not electrically contacted. Since the second emitters are not electrically contacted, they are not supplied with power during operation of the laser diode bar.

The method according to embodiments ensures that only those emitters for which the at least one tested electrical and/or optical property lies within the specified setpoint range are supplied with power during operation of the finished laser diode bar. In this way, it is advantageously prevented that during operation of the laser diode bar, even those emitters are supplied with current which, for example, due to manufacturing tolerances and/or a defect do not or at least not sufficiently contribute to the emission of radiation.

The group of second emitters may in particular include faulty emitters for which the threshold current is not exceeded at the intended operating current strength. The fact that such defective emitters are not electrically connected in the method described herein prevents them from showing a current flow during operation of the finished laser diode bar and contributing to heating of the laser diode bar but not to radiation emission. By avoiding electrical connection of the faulty emitters, the power consumption of the laser diode bar is reduced and efficiency is improved.

According to at least one embodiment, the p-connection layer is a solder layer. In particular, the laser diode bar may be connected to a carrier by means of the solder layer on the first main surface on which the p-contacts of the emitters are arranged. The carrier can be a heat sink for the laser diode bar in particular.

According to at least one embodiment, the electrically insulating layer comprises a lacquer or ink and is selectively applied to the p-contacts of the second emitters. The lacquer or ink can be selectively applied to the p-contacts of the second emitters using an inkjet process. "Selective" here means that the p-contacts of the first emitters remain free of the lacquer or ink.

According to an alternative embodiment, the electrically insulating layer comprises a photoresist layer which is applied to the p-contacts of the first and second emitters. The photoresist layer can be applied over the entire surface of the first main surface of the laser diode bar, so that both the p-contacts of the first emitters and the p-contacts of the second emitters are covered by the photoresist layer. The photoresist layer is advantageously removed from the p-contacts of the first emitters in a further step, so that the p-contacts of the first emitters are exposed and electrically contacted when the p-connecting layer is applied. The removal of the photoresist layer from the first emitters can be done by exposing the photoresist layer on the p-contacts of the first emitters and removing it from the first emitters by developing it. Exposure can take place in particular with UV light. In contrast, the photoresist layer on the p-contacts of the second emitters is not exposed and is not removed again.

According to an alternative embodiment, the electrically insulating layer comprises an oxide layer applied to the p-contacts of the first and second emitters, the oxide layer subsequently being removed from the p-contacts of the first emitters. The oxide layer is preferably a silicon oxide layer, especially a $SiO_2$ layer. For example, the oxide layer can first be applied over the entire surface of the first main surface of the laser diode bar so that it covers both the p-contacts of the first emitters and the p-contacts of the second emitters. The oxide layer is applied, for example, using a vacuum coating process, in particular a CVD process.

In the embodiment of the electrically insulating layer as an oxide layer, the p-contacts of the first and second emitters, in particular gold, can be treated with an oxygen plasma to produce a gold oxide layer on the surface of the p-contacts before the oxide layer is applied. The electrically insulating layer, in particular a silicon oxide layer, is subsequently applied to the gold oxide layer. In a further step, the first emitters are electrically operated to generate heat that at least partially decomposes the gold oxide layer so that the electrically insulating layer adheres less well to the p-contacts of the first emitters than to the p-contacts of the second emitters.

According to an embodiment the first emitters for decomposing the gold oxide layer are operated at a power significantly higher than the power intended to operate the laser diode bar to generate enough heat to decompose the gold oxide layer. A gold oxide layer disintegrates into Au and $O_2$ at a temperature of at least 160° C. In order to achieve such a high temperature, a higher current and/or in pulsed operation a higher duty cycle than in normal operation of the laser diode bar can be used.

Subsequently, the electrically insulating layer is at least partially detached from the p-contacts of the first emitters, so that they can be exposed and electrically contacted by applying the p-connecting layer. The electrically insulating layer can be detached from the p-contacts of the first emitters in particular by tearing off a tape (tape lift-off). In this case, an adhesive tape is applied to the p-contacts, whereby the oxide layer is detached from the p-contacts of the first emitters during lift-off due to the poorer adhesion.

The method is particularly advantageous for laser diode bars having a semiconductor layer sequence that is based on a nitride compound semiconductor material. The semiconductor layer sequence may in particular include layers from the material system $In_xAl_yGa_{1-x-y}N$, where $0 \leq x \leq 1$, $0 \leq y \leq 1$ and $x+y \leq 1$. In the production of nitride compound semiconductor layers, it is possible that increased defect densities occur in comparison with other material systems such as arsenide compound semiconductors. In particular, this can lead to differences in the threshold current intensities of the emitters. At a given operating current intensity it would therefore be possible that some emitters of the laser diode bar do not emit any laser light, but consume electricity and contribute to the heating of the laser diode bar. In the method described here, this effect is reduced by detecting faulty emitters during manufacture and not electrically connecting them when the laser diode bar is completed.

According to embodiments, a laser diode bar is described, which can be produced in particular with the method described above. According to at least one embodiment, the laser diode bar comprises a plurality of emitters arranged side by side. The emitters each have a semiconductor layer sequence with an active layer suitable for generating laser radiation, a p-contact and an n-contact. In particular, each emitter represents a laser diode. The p-contact of the emitters is preferably located on a first main surface of the laser diode bar and the n-contact is located on a second main surface of the laser diode bar opposite the first main surface. The re-contact of the emitters can be designed as a common n-contact of all emitters of the laser diode bar.

The emission directions of the emitters may be parallel to each other. The laser diode bar preferably has a first and a second side facet, which are preferably provided with a reflective coating to form a laser resonator for the emitters. In this case, one of the side facets functions advantageously as a radiation exit surface for the laser radiation and preferably has a lower reflectivity than the opposite side facet.

According to embodiments the laser diode bar comprises a first group of emitters that are electrically contacted and a second group of emitters that are not electrically contacted. In particular, both the p-contact and the n-contact of the first emitters are electrically contacted in order to supply the emitters with power during operation of the laser diode bar. The p-contacts of the first emitters are each electrically contacted by means of a p-connecting layer. The p-contacts of the second emitters are separated from the p-connecting layer by an electrically insulating layer. With the second emitters, the p-contact is therefore not electrically contacted, so that the second emitters are not supplied with power during operation of the laser diode bar.

According to at least one embodiment, the p-connecting layer is a solder layer, and the laser diode bar is connected to a substrate at the first main surface on which the p-contacts of the emitters are arranged by means of the solder layer.

In an embodiment of the laser diode bar, the electrically insulating layer comprises a lacquer or ink. In this case, the electrically insulating layer can be applied advantageously using an inkjet process.

In a further embodiment, the electrical insulating layer is a photoresist layer.

In another embodiment, the electrical insulating layer is an oxide layer, especially a silicon oxide layer. In this embodiment, a gold oxide layer can be arranged between the p-contacts of the second emitter and the electrically insulating layer.

The semiconductor layer sequence of the laser diode bar is based in particular on a nitride compound semiconductor material. The laser diode bar can be provided in particular for emitting radiation with a wavelength in the blue, green or UV spectral range.

Further advantageous embodiments of the laser diode bar result from the previous description of the manufacturing method and vice versa.

BRIEF DESCRIPTION OF THE DRAWINGS

Embodiments of the invention are explained in more detail in connection with FIGS. 1 to 3.

Identical or identical components are marked with the same reference signs in the figures. The components shown and the proportions between the components are not to be regarded as true to scale.

DETAILED DESCRIPTION OF ILLUSTRATIVE EMBODIMENTS

Figure 1A:
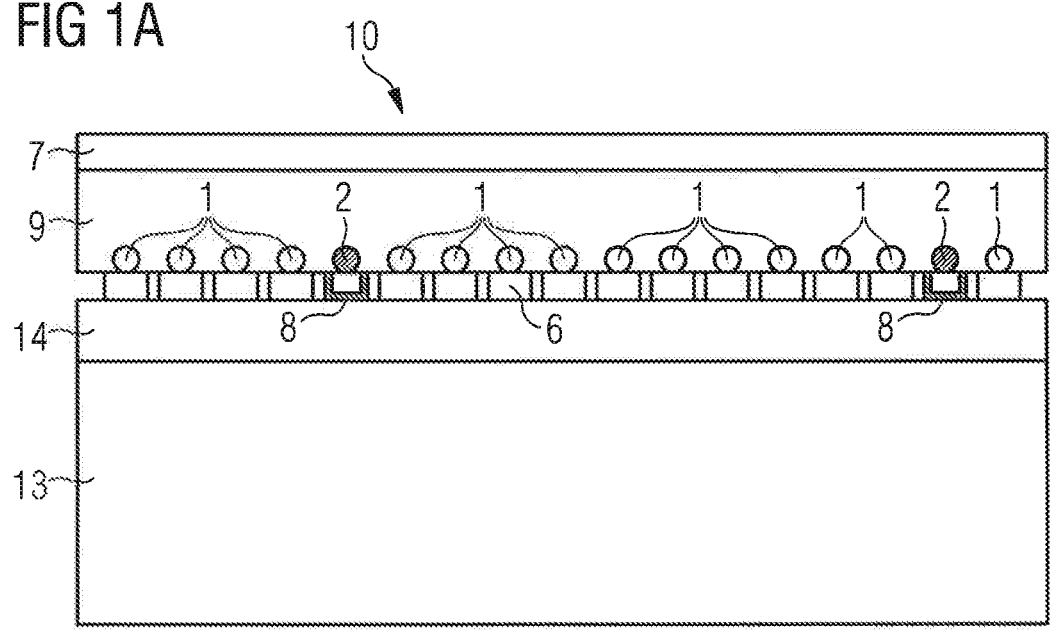
FIG. 1A shows a schematic representation of a cross-section of a laser diode bar according to a first embodiment.
Figure 1B:
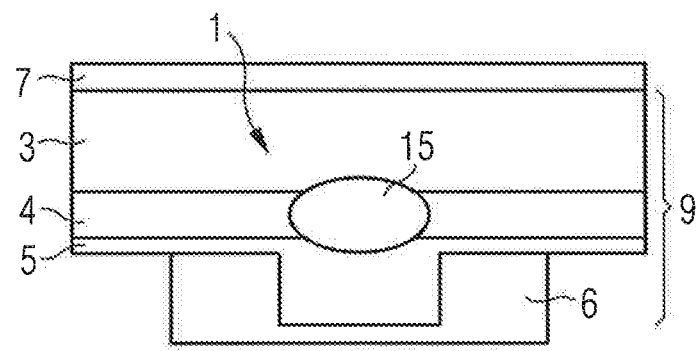
FIG. 1B shows a schematic representation of a cross-section of a first emitter in the first embodiment.
Figure 1C:
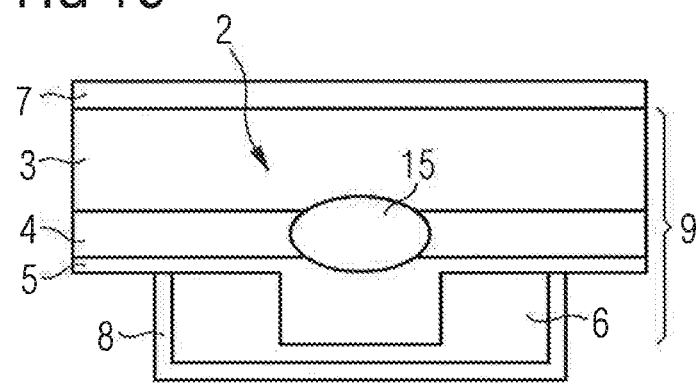
FIG. 1C shows a schematic representation of a cross-section of a second emitter in the first embodiment.

FIG. 1A shows a schematic cross section of an embodiment of the laser diode bar 10. The laser diode bar 10 has a plurality of emitters 1, 2 arranged next to each other. Enlarged views of a first emitter 1 and a second emitter 2 are shown in FIGS. 1B and 1C. Emitters 1, 2 each have a semiconductor layer sequence 9 comprising an n-type semiconductor region 3, a p-type semiconductor region 5 and an active layer 4 disposed between the n-type semiconductor region 3 and the p-type semiconductor region 5. The p-type semiconductor region 5 can be designed as a ridge waveguide. In this case, at least part of the p-type semiconductor region 5, for example, is narrowed to a ridge by an etching process in order to concentrate the emission region on a narrow region in comparison to the width of the semiconductor layer sequence.

The semiconductor layer sequence 9 can be based in particular on a nitride compound semiconductor. This means in the present context that the semiconductor layer sequence 9 or at least one layer thereof comprises a III-nitride compound semiconductor material, preferably $In_xAl_yGa_{1-x-y}N$, where $0 \leq x \leq 1$, $0 \leq y \leq 1$ and $x+y \leq 1$. The material does not necessarily have to have a mathematically exact composition according to the above formula. Rather, it may contain one or more dopants and additional components. For simplicity, however, the above formula contains only the essential components of the crystal lattice (In, Al, Ga, N), even if these can be partially replaced by small amounts of other substances.

The active layer 4 can, for example, be designed as a pn junction, a double heterostructure, a single quantum well structure or a multiple quantum well structure. The term quantum well structure encompasses any structure in which charge carriers undergo a quantization of their energy states by confinement. In particular, the term quantum well structure does not contain any information about the dimensionality of the quantization. It thus includes, among other things, quantum wells, quantum wires and quantum dots and any combination of these structures.

The emitters 1, 2 of laser diode bar 10 arranged next to each other each have a p-contact 6 on a first main surface 11 and an n-contact 7 on a second main surface 12 opposite the first main surface 11. In the embodiment, emitters 1, 2 have a common n-contact 7 and separate p-contacts 6.

For the detection of faulty emitters 2, at least one optical and/or electrical property of emitters 1, 2 is advantageously tested in the method for the production of laser diode bar 10. The test of emitters 1, 2 may in particular include an optical check of the emitters and/or a test electrical connection of emitters 1, 2 in order to measure at least one optical and/or electrical property. For example, the emitted intensity at a given current intensity and/or the threshold current intensity at which the laser emission of emitters 1, 2 begins can be determined. Emitters 1, in which the at least one tested optical and/or electrical property lies within a setpoint range, are assigned to a group of first emitters 1, which are electrically connected when the laser diode bar 10 is completed. On the other hand, faulty emitters 2, in which the at least one tested optical and/or electrical property does not lie within a predetermined setpoint range, are assigned to a group of second emitters 2, and are not electrically connected when the laser diode bar 10 is completed.

The p-contacts 6 of the second emitters 2 are provided with an electrically insulating layer 8 in the method for producing the laser diode bar, so that the second emitters 2 are not electrically contacted. In contrast, the p-contacts of the first emitters 1 are not provided with the electrically insulating layer 8, or the electrically insulating layer 8 is removed from the first emitters 1 after application. For electrical contacting of the laser diode bar at the p-side, a p-connecting layer 14 is applied to the p-contacts 6. The p-connection layer 14 can be in particular a solder layer with which the laser diode bar 10 is fixed to a carrier 13.

Because p-contacts 6 of the second emitters 2 are covered by the electrically insulating layer, they are not electrically contacted by the p-connecting layer 14. The second emitters 2 are therefore not supplied with power during operation of laser diode bar 10. In this way it is advantageously possible to prevent the current supply to defective emitters 2 or emitters contributing only insufficiently to radiation emission. Such faulty emitters 2 would otherwise generate heat loss during operation of the laser diode bar 10 and contribute to heating of the laser diode bar 10, but would not contribute to radiation emission. Because the faulty second emitters 2 are not supplied with power, the efficiency of the laser diode bar 10 increases advantageously.

The application of the electrically insulating layer 8 to the second emitters 2 can be carried out in the method for producing the laser diode bar 10, for example, with an inkjet process. In this embodiment, the electrical insulating layer 8 is a lacquer or ink and is applied directly to the second emitters 2 using a maskless printing process.

Figure 2A:
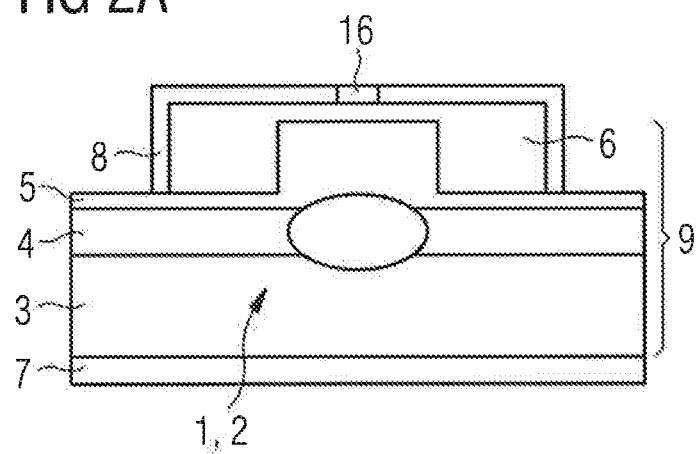
FIG. 2A shows a schematic representation of a cross-section of an emitter in a second embodiment.
Figure 2B:
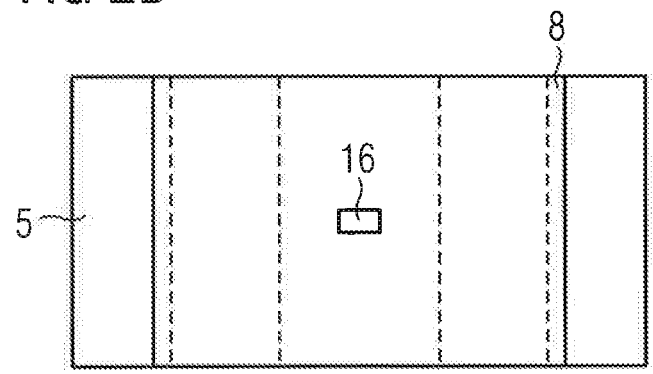
FIG. 2B shows a schematic representation of a top view of the emitter in the second embodiment.

In FIGS. 2A and 2B an emitter 1, 2 of the laser diode bar 10 according to another embodiment is shown in a cross section and in a plan view. In this embodiment, the electrically insulating layer 8 is a photoresist layer. The photoresist layer can, for example, be applied to several laser diode bars simultaneously during production in a wafer composite. A contact window 16 is formed in the photoresist layer. Contact window 16 is an opening in photoresist layer 8 through which emitters 1, 2 can be tested before mounting. In particular, a test needle can be passed through the contact window 16 to the p-contact 6, for example, to measure an electrical property when testing the emitter.

The thickness of photoresist layer 8 and contact window 16 are preferably dimensioned in such a way that the solder does not penetrate to the p-contact 6 when mounting the laser diode bar on a carrier. The photoresist layer 8 advantageously has a thickness between 1 μm and 10 μm, preferably between 2 μm and 6 μm. The contact window 16 has advantageously a length along the resonator axis of the semiconductor laser which is not more than 4 mm, with the width in the direction perpendicular thereto being not more than 1 mm. The preferred length of the contact window 16 is between 100 µm and 200 µm and the width between 50 µm and 100 µm.

Instead of forming a contact window 16 in the electrically insulating layer 8, the test needle may also pierce the electrically insulating layer 8. This is particularly possible if the electrical insulating layer 8 is a photoresist layer. When the electrically insulating layer 8 is a photoresist layer, it is removed from the first emitters 1, in which the at least one optical and/or electrical property lies within the setpoint range, after testing emitters 1, 2. This can be done in particular by exposing the photoresist layer on the first emitters 1 and removing it by developing the photoresist layer. The photoresist layer is not removed from the second emitters 2, however, but remains as an electrically insulating layer 8 on the second emitters 2 in order to electrically isolate their p-contacts 6 from the p-connecting layer during assembly.

In FIGS. 3A to 3E, an emitter 1, 2 of the laser diode bar 10 is shown during intermediate steps of a method for the production of the laser diode bar. In the method step shown in FIG. 3A, a plasma treatment of the p-contacts 6 of the emitters is carried out, where the plasma is an oxygen plasma. The oxygen plasma produces a thin oxide layer on the surface of the p-contacts 6. The p-contacts 6 may contain gold in particular, so that a thin gold oxide layer 17 is formed on their surface by plasma treatment.

Figure 3A:
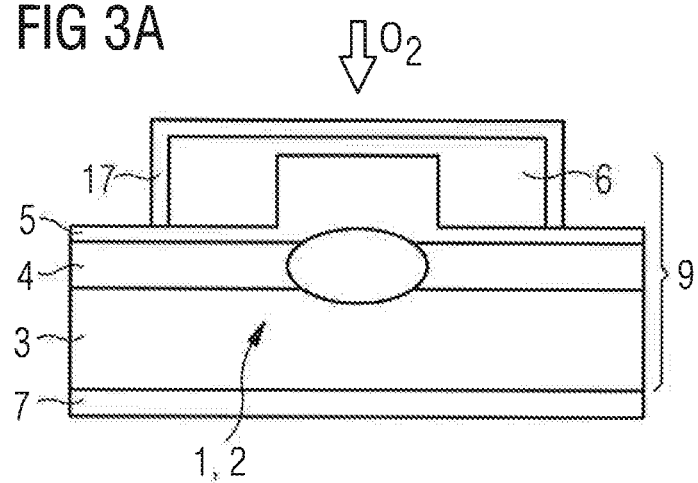
FIGS. 3A to 3E show a schematic representation of a cross-section of an emitter during intermediate steps of the method for producing the laser diode bar according to an embodiment.
Figure 3B:
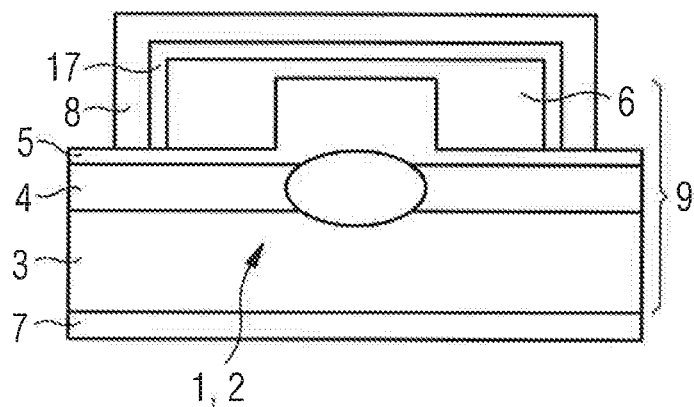

In the intermediate step shown in FIG. 3B, the electrical insulating layer 8 is applied to the gold oxide layer 17. The electrically insulating layer 8 is an oxide layer, in particular a silicon oxide layer. The silicon oxide layer 8 is preferably applied using a CVD process. If emitters 1, 2 are tested after the electrically insulating layer 8 has been applied, a contact window can be formed in the electrically insulating layer 8 as in the example in FIGS. 2A and 2B (not shown here).

Figure 3C:
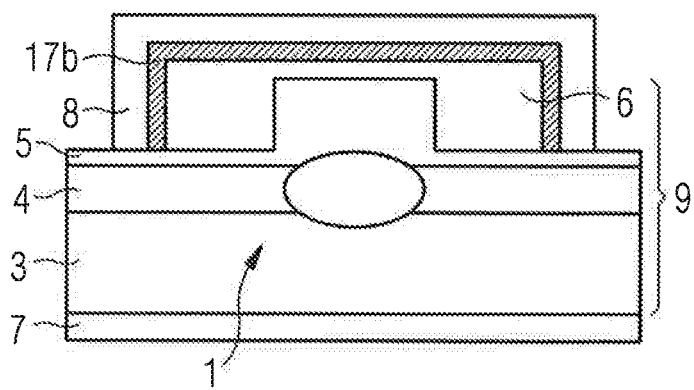

In the intermediate step shown in FIG. 3C, the first emitters 1, for which the at least one optical and/or electrical property is within the setpoint range during the test, are operated with such a high current that the emitters 1 generate heat by which the gold oxide layer 17 is completely or at least partially decomposed. The emitters 1 are operated in particular with a current intensity, which leads to a heating of the gold oxide layer up to a temperature of at least 160° C. At a temperature of at least 160° C., a gold oxide layer disintegrates into Au and $O_2$. The at least partially decomposed gold oxide layer 17b of the first emitters 1 causes the electrically insulating layer 8 to adhere less to the p-contacts 6 of the first emitters 1 than to the second emitters 2, in which the gold oxide layer is not thermally decomposed.

Figure 3D:
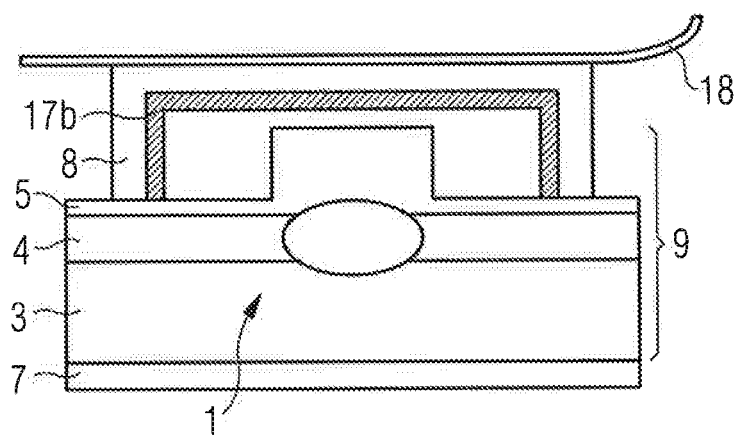

The poor adhesion of the electrically insulating layer 8, in particular a silicon oxide layer, makes it relatively easy to remove it from the p-contacts 6 of the first emitters 1. This can be done, for example, by tearing off adhesive tape as shown in FIG. 3D. In this embodiment, an adhesive tape 18 is applied to the electrical insulating layer 8 of emitters 1, 2. When the adhesive tape 18 is torn off, the electrical insulating layer 8 is removed from the first emitters 1 due to poor adhesion. On the other hand, the electrically insulating layer 8 remains on the second emitters 2, where adhesion is not impaired by decomposition of the gold oxide layer.

Figure 3E:
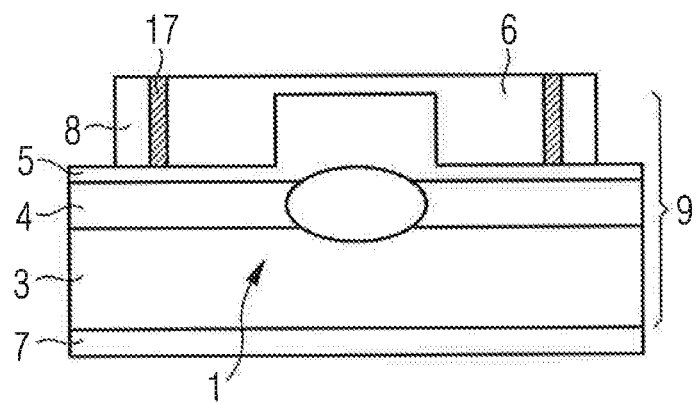

As shown in FIG. 3E, the p-contacts 6 of the first emitters 1 are exposed after the adhesive tape has been torn off. These can be electrically contacted when mounting the laser diode bar on a carrier, for example, by means of a solder layer.

The invention is not limited by the description based on the embodiments. Rather, the invention includes each new feature and each combination of features, which includes in particular each combination of features in the claims, even if this feature or this combination itself is not explicitly indicated in the claims or embodiments.

What is claimed is:

1. A method for forming a laser diode bar, the method comprising:
   arranging a plurality of emitters side by side, each emitter having a semiconductor layer sequence with an active layer suitable for generating laser radiation, a p-contact and an n-contact;
   testing at least one optical and/or electrical property of the emitters;
   assigning emitters for which the optical and/or electrical property lies within a predetermined setpoint range to a group of first emitters;
   assigning emitters for which the at least one optical and/or electrical property lies outside the predetermined setpoint range to a group of second emitters;
   applying an electrically insulating layer to at least the p-contacts of the second emitters; and
   electrically contacting the p-contacts of the first emitters by applying a p-connecting layer to the p-contacts of the first emitters,
   wherein the electrically insulating layer is selectively applied so that the p-contacts of the second emitters are electrically insulated from the p-connecting layer while the p-contacts of the first emitters are electrically contacted.

2. The method according to claim 1, wherein the p-connecting layer is a solder layer, and wherein the laser diode bar is connected to a carrier by the solder layer at a first main surface on which the p-contacts of the plurality of emitters is arranged.

3. The method according to claim 1, wherein the electrically insulating layer comprises a lacquer or an ink and is selectively applied to the p-contacts of the second emitters.

4. The method according to claim 1, wherein the electrically insulating layer comprises a photoresist layer which is applied to the p-contacts of the first and second emitters, wherein the photoresist layer is exposed on the p-contacts of the first emitters and subsequently removed, and wherein the photoresist layer is not exposed and is not removed on the p-contacts of the second emitters.

5. The method according to claim 1, wherein the electrically insulating layer comprises an oxide layer which is applied to the p-contacts of the first and second emitters and, and wherein the oxide layer is removed from the p-contacts of the first emitters.

6. The method according to claim 5, wherein the p-contacts of the first and second emitters comprise gold and are treated with an oxygen plasma to produce a gold oxide layer on a surface of the p-contacts before the electrically insulating layer is applied, and wherein the gold oxide layer after application of the electrically insulating layer is at least partially decomposed by heat produced during operation of the first emitters so that the electrically insulating layer adheres to the p-contacts of the first emitters less than to the p-contacts of the second emitters, and wherein the electrically insulating layer is at least partially detached from the p-contacts of the first emitters.

7. The method according to claim 1, wherein the semiconductor layer sequence comprises a nitride compound semiconductor material.

8. A laser diode bar comprising:
a plurality of emitters arranged side by side, each emitter having a semiconductor layer sequence with an active layer configured to generate laser radiation, a p-contact and an n-contact,
wherein the emitters comprise a group of electrically contacted first emitters and a group of non-electrically contacted second emitters, and
wherein the p-contacts of the first emitters are electrically contacted by a p-connecting layer while the p-contacts of the second emitters are separated by an electrically insulating layer from the p-connecting layer, the p-contacts of the second emitters being not electrically contacted.

9. The laser diode bar according to claim 8, wherein the p-connecting layer is a solder layer, and wherein the laser diode bar is connected to a support by the solder layer on a first main surface on which the p-contacts of the plurality of emitters is arranged.

10. The laser diode bar according to claim 8, wherein the electrically insulating layer comprises a lacquer or an ink.

11. The laser diode bar according to claim 8, wherein the electrically insulating layer is a photoresist layer.

12. The laser diode bar according to claim 8, wherein the electrically insulating layer is an oxide layer.

13. The laser diode bar according to claim 12, wherein the electrically insulating layer is a silicon oxide layer.

14. The laser diode bar according to claim 12, wherein a gold oxide layer is arranged between p-contacts of the second emitters and the electrically insulating layer.

15. The laser diode bar according to claim 8, wherein the semiconductor layer sequence comprises a nitride compound semiconductor material.

16. A laser diode bar comprising:
a plurality of emitters arranged side by side, each emitter having a semiconductor layer sequence with an active layer suitable for generating laser radiation, a p-contact and an re-contact,
wherein the emitters comprise a group of electrically contacted first emitters and a group of non-electrically contacted second emitters,
wherein the p-contacts of the first emitters are electrically contacted by a p-connecting layer,
wherein the p-contacts of the second emitters are separated from the p-connecting layer by an electrically insulating layer and are not electrically contacted,
wherein the electrically insulating layer is an oxide layer, and
wherein a gold oxide layer is arranged between p-contacts of the second emitters and the electrically insulating layer.

* * * * *

UNITED STATES PATENT AND TRADEMARK OFFICE
CERTIFICATE OF CORRECTION

PATENT NO.         : 10,505,337 B2
APPLICATION NO.    : 16/156134
DATED              : December 10, 2019
INVENTOR(S)        : Gerhard et al.

It is certified that error appears in the above-identified patent and that said Letters Patent is hereby corrected as shown below:

On the Title Page

Item (73) Assignee, Line 1, delete "SEMICONDUCTOR" and insert --SEMICONDUCTORS--.

In the Claims

In Column 10, Line 11, Claim 16, delete "re-contact" and insert --n-contact--.

Signed and Sealed this
Seventh Day of April, 2020

Andrei Iancu
*Director of the United States Patent and Trademark Office*